(12) United States Patent
Feng et al.

(10) Patent No.: US 9,985,035 B1
(45) Date of Patent: May 29, 2018

(54) SEMICONDUCTOR MEMORY STRUCTURE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Li-Wei Feng, Kaohsiung (TW); Chien-Ting Ho, Taichung (TW); Yu-Cheng Tung, Kaohsiung (TW)

(73) Assignees: UNITED MICROELECTRONICS CORP., Hsin-Chu (TW); Fujian Jinhua Integrated Circuit Co., Ltd., Quanzhou, Fujian province (CN)

( * ) Notice: Subject to any disclaimer, the term of this patent is extended or adjusted under 35 U.S.C. 154(b) by 0 days. days.

(21) Appl. No.: 15/820,455

(22) Filed: Nov. 22, 2017

Related U.S. Application Data

(63) Continuation of application No. 15/479,290, filed on Apr. 5, 2017, now Pat. No. 9,859,283.

(30) Foreign Application Priority Data

Mar. 7, 2017 (CN) .......................... 2017 1 0131023

(51) Int. Cl.
*H01L 27/108* (2006.01)
*H01L 21/8242* (2006.01)

(52) U.S. Cl.
CPC .... *H01L 27/10885* (2013.01); *H01L 27/1085* (2013.01); *H01L 27/10808* (2013.01); *H01L 27/10814* (2013.01); *H01L 27/10894* (2013.01); *H01L 27/10897* (2013.01)

(58) Field of Classification Search
None
See application file for complete search history.

(56) References Cited

U.S. PATENT DOCUMENTS

| | | | |
|---|---|---|---|
| 6,118,145 | A | 9/2000 | Egawa |
| 9,287,395 | B2 | 3/2016 | Jeong |
| 9,379,114 | B2 | 6/2016 | Jeong et al. |
| 9,431,324 | B2 | 8/2016 | Shin |
| 2001/0012229 | A1 | 8/2001 | Dosaka |
| 2002/0060351 | A1 | 5/2002 | Shin |
| 2003/0119243 | A1 | 6/2003 | Shin |
| 2007/0170547 | A1 | 7/2007 | Chang |
| 2010/0330791 | A1 | 12/2010 | Kang |
| 2013/0256769 | A1 | 10/2013 | Jeong |

*Primary Examiner* — Robert Bachner
*Assistant Examiner* — Molly Reida
(74) *Attorney, Agent, or Firm* — Winston Hsu

(57) ABSTRACT

A semiconductor memory structure includes a substrate including a memory cell region and a cell edge region adjacent to the memory cell region. Active regions are formed in the substrate and in the memory cell region and the cell edge region. At least a dummy bit line is formed on the active regions in the cell edge region. The dummy bit line extends along a first direction and overlaps at least two active regions along a second direction. The dummy bit line further includes a first inner line portion and an outer line portion. The first inner line portion and the outer line portion extend along the first direction and a width of the first inner line portion is different from a width of the outer line portion.

19 Claims, 12 Drawing Sheets

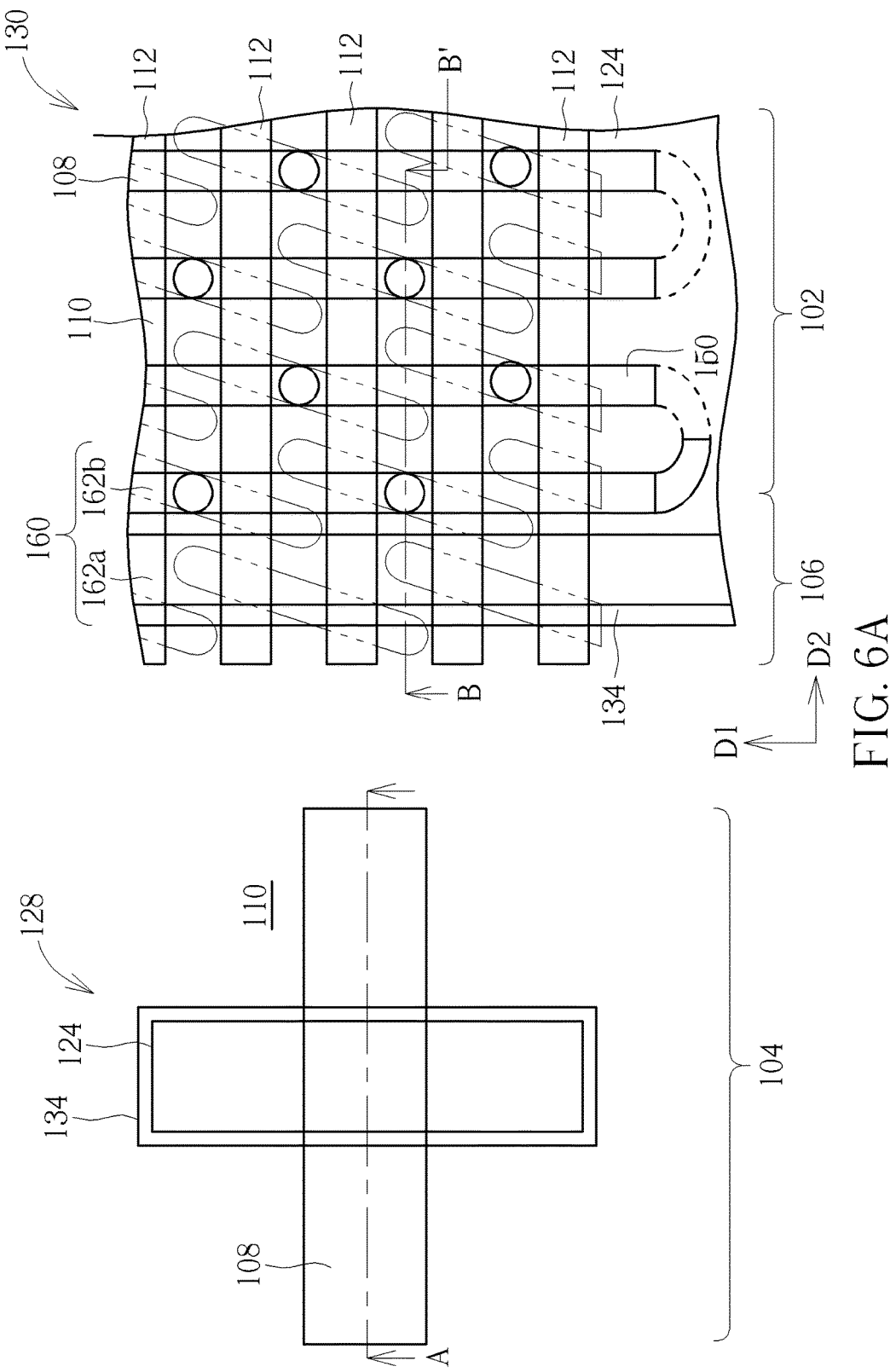

SEMICONDUCTOR MEMORY STRUCTURE

CROSS REFERENCE TO RELATED APPLICATIONS

This application is a continuation of application Ser. No. 15/479,290 filed on Apr. 5, 2017, entitled "SEMICONDUCTOR MEMORY STRUCTURE", and the entire content of which is hereby incorporated by reference.

BACKGROUND OF THE INVENTION

1. Field of the Invention

The present invention relates to a semiconductor memory structure, and more particularly, to a dynamic random access memory (hereinafter abbreviated as DRAM) semiconductor structure.

2. Description of the Prior Art

DRAM is a volatile memory that commonly used as system memory. A memory cell array of DRAM has a configuration in which memory cells, each including an access field effect transistor (FET) and a storage capacitor, are arranged in array-like manner, i.e. in row and column directions.

The storage capacitors are formed either by etching trenches in the substrate in each of the cell areas, commonly referred to as trench capacitors, or are formed over the access FETs in the cell areas by depositing and patterning conducting layers over the access transistors, and are commonly referred to as stacked capacitors. The capacitors make electrical contact to one of the two source/drain areas (node contact) of each FET, while bit lines make electrical contact to the other source/drain area of each FET. It is becoming increasingly difficult to fabricate more memory cells on a DRAM device while limiting the overall DRAM device area to a practical size without decreasing the cell area. Further, as the cell area decreases, the available area for the storage capacitor in each cell also decreases. This makes it difficult to maintain sufficient capacitance to provide the necessary signal-to-noise ratio. Also, the refresh cycle time necessary to maintain sufficient charge on these capacitors also decreases, resulting in DRAM devices with reduced performance (speed). Therefore, one method in the semiconductor industry of overcoming the above problems is to form DRAM devices having stacked capacitors. These types of capacitors extend vertically upward over the MOS transistors. The two basic types of stacked capacitor DRAM cells of the prior art are the capacitor over bit line (hereinafter abbreviated as COB) and capacitor under bit line (CUB).

As memory cells of DRAM become more integrated and miniaturized, fabrication of those elements becomes more difficult. Furthermore, DRAM includes not only the memory cells that are arranged in array-like manner in the memory region but also other logic devices that are formed in non-memory/peripheral region. Therefore the different device densities between the memory cells and the logic devices further induce process issue.

SUMMARY OF THE INVENTION

According to an aspect of the present invention, a semiconductor memory structure is provided. The semiconductor memory structure includes a substrate including a memory cell region and a cell edge region adjacent to the memory cell region. A plurality of active regions are formed in the memory cell region. At least a dummy bit line is formed on the active regions in the cell edge region. The dummy bit line extends along a first direction and overlaps at least two active regions along a second direction. The dummy bit line further includes a first inner line portion and an outer line portion and the first inner line portion and the outer line portion are extending along the first direction. A width of the first inner line portion is different from a width of the outer line portion.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1A-6B and 8 are schematic drawings illustrating a method for forming a semiconductor memory structure provided by a preferred embodiment of the present invention, wherein

FIG. 3 is a schematic drawing in a step subsequent to FIG. 2B;

FIG. 4 is a schematic drawing in a step subsequent to FIG. 3;

FIG. 5 is a schematic drawing in a step subsequent to FIG. 4;

FIG. 6B is a cross-sectional view taken along the Lines A-A' and B-B' of FIG. 6A;

FIG. 8 is a cross-sectional view taken along the Lines A-A' and B-B' of FIG. 6A.

FIG. 7A-7B are schematic drawings illustrating a modification to the preferred embodiment, and wherein FIG. 7B is a cross-sectional taken along Lines C-C' and D-D' of FIG. 7A.

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have been described in detail in order to avoid obscuring the invention.

It will be understood that when an element is referred to as being "formed" on another element, it can be directly or indirectly, formed on the given element by growth, deposition, etch, attach, connect, or couple. And it will be understood that when an elements or a layer is referred to as being "on", "connected to", or "coupled to" another element or layer, it can be directly on, connected or coupled to the other element or layer or intervening elements or layers may be present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

Spatially relative terms, such as "beneath", "below", "lower", "above", "upper", "in", "on" and the like, may be used herein for ease of description to describe one element or feature's relationship to another element(s) or feature(s) as illustrated in the figures. It will be understood that spatially relative terms are intended to encompass different orientations of the device in use or operation in addition to the orientations depicted in the figures. For example, if the device in the figures in turned over, elements described as "below" or "beneath" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of the inventions. As used herein, the singular form "a", "an" and "the" are intended to include the plural forms as well, unless the context clearly indicates otherwise.

Figure 1A:
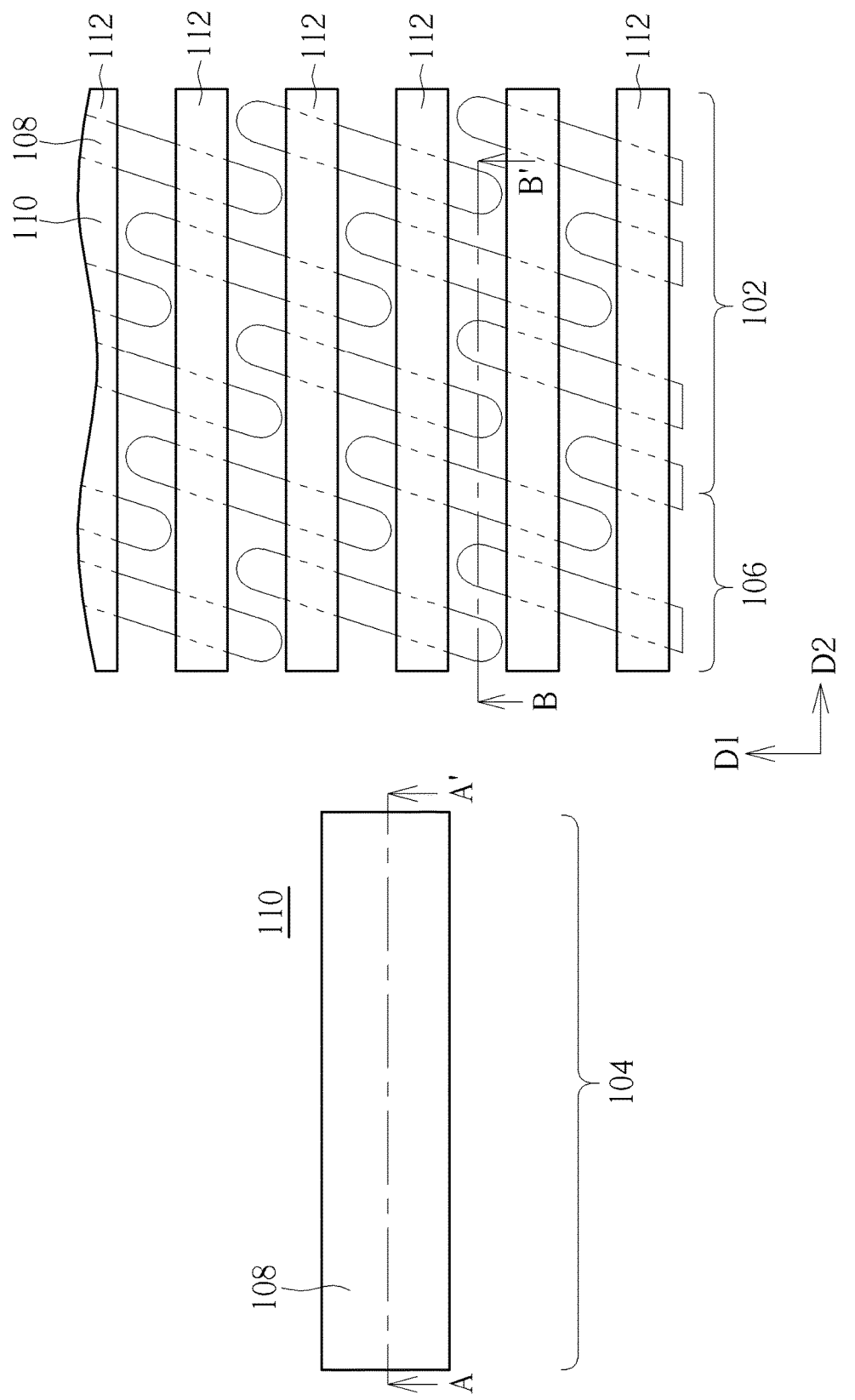

Please refer to FIGS. 1A-6B and 8, which are schematic drawings illustrating a method for forming a semiconductor memory structure provided by a preferred embodiment of the present invention. It is noteworthy that FIG. 1B is a cross-sectional view taken along Lines A-A' and B-B' of FIG. 1A, FIG. 2B is a cross-sectional view taken along the Lines A-A' and B-B' of FIG. 2A, and so on. As shown in FIGS. 1A and 1B, the method for forming the semiconductor memory structure of the preferred embodiment first provides a substrate 100, and the substrate 100 can include a silicon (Si) substrate, a germanium (Ge) substrate, or a SiGe substrate, but not limited to this. The substrate 100 includes at least a memory cell region 102 and a peripheral circuit region 104 defined thereon. More important, the substrate 100 includes a cell edge region 106 defined in between the memory cell region 102 and the peripheral circuit region 104 according to the preferred embodiment. A plurality of active regions 108 are formed in the substrate 100 in the memory cell region 102, the peripheral circuit region 104, and the cell edge region 106 as shown in FIG. 1A. Furthermore, the active regions 108 are electrically isolated from each other by a plurality of isolation structures 110, such as a shallow trench isolations (STIs). Consequently, the active regions 108 respectively include an island shape, as shown in FIG. 1A.

Please refer to FIG. 1A. Next, a plurality of recesses (not shown) are formed in the memory cell region 102 and the cell edge region 106, and a dielectric layer (not shown) is then formed to cover sidewalls and bottoms of the recesses. Thereafter, a buried gate 112 is formed in each recess and followed by forming an insulating layer sealing the recesses. It is noteworthy that the buried gates 112 are arranged along a first direction D1 and extend along a second direction D2. The first direction D1 and second direction D2 are perpendicular to each other. The buried gates 120 can include doped semiconductor material such as doped silicon, metal material such as tungsten (W), aluminum (Al), titanium (Ti), and/or tantalum (Ta), metal nitride such as titanium nitride (TiN), tantalum nitride (TaN), and/or tungsten nitride (WN), and metal-semiconductor compound such as metal silicide, but not limited to this.

Figure 1B:
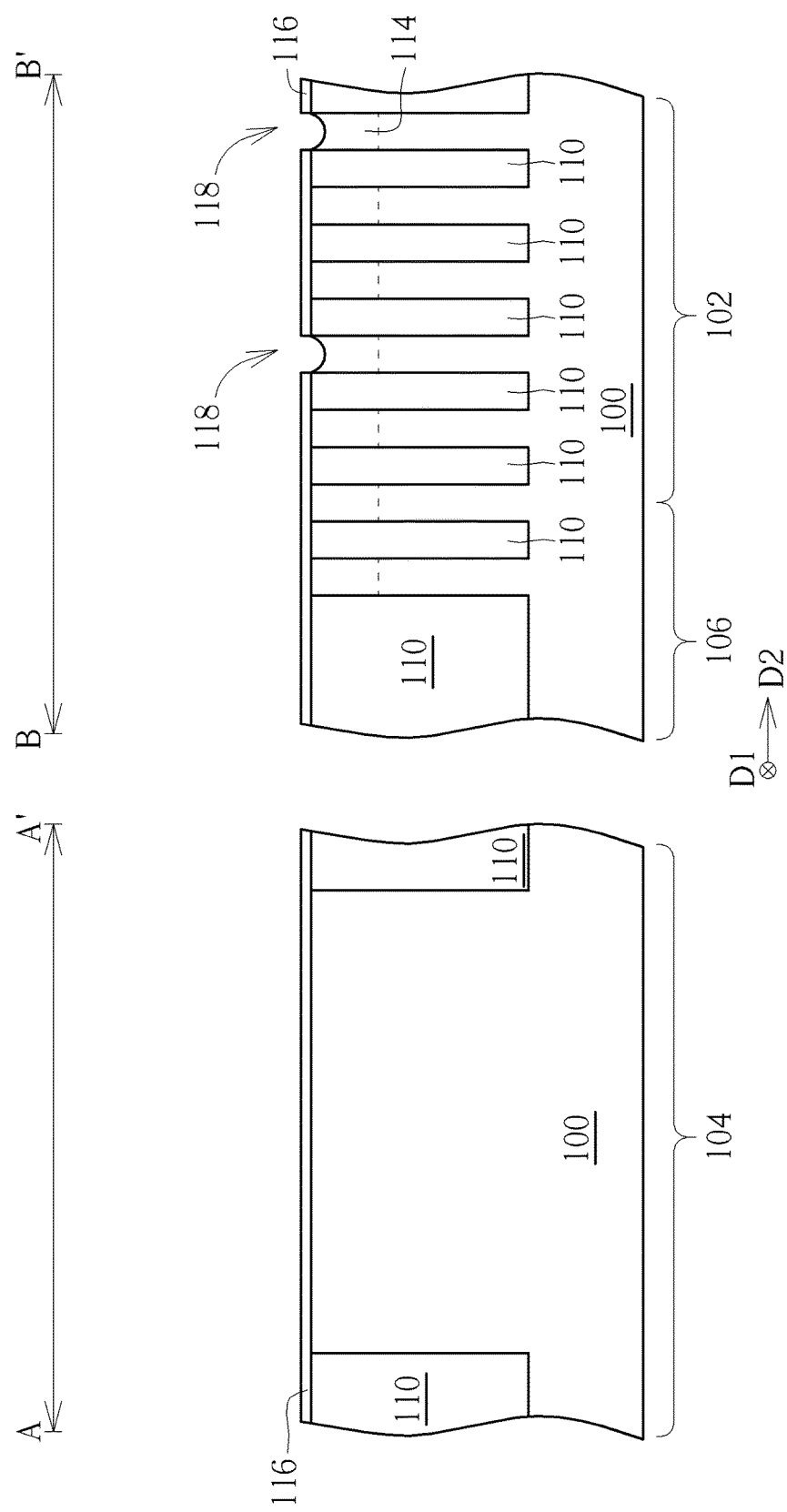
FIG. 1B is a cross-sectional view taken along Lines A-A' and B-B' of FIG. 1A.

Please refer to FIG. 1B. Next, source/drain regions (not shown) are formed in the active regions 108 at two sides of the buried gates 112. After forming the source/drain regions, an insulating layer 116 is blanketly formed on the substrate 100 and followed by patterning portions of the insulating layer 116 in the memory cell region 102 and the cell edge region 106. Consequently, portions of the source/drain regions in the memory cell region 102 and the cell edge region 106 are exposed and etched, thus a plurality of recesses 118 are formed. The recesses 118 are formed to define locations and size of a plurality of bit line contact plugs.

Figure 2A:
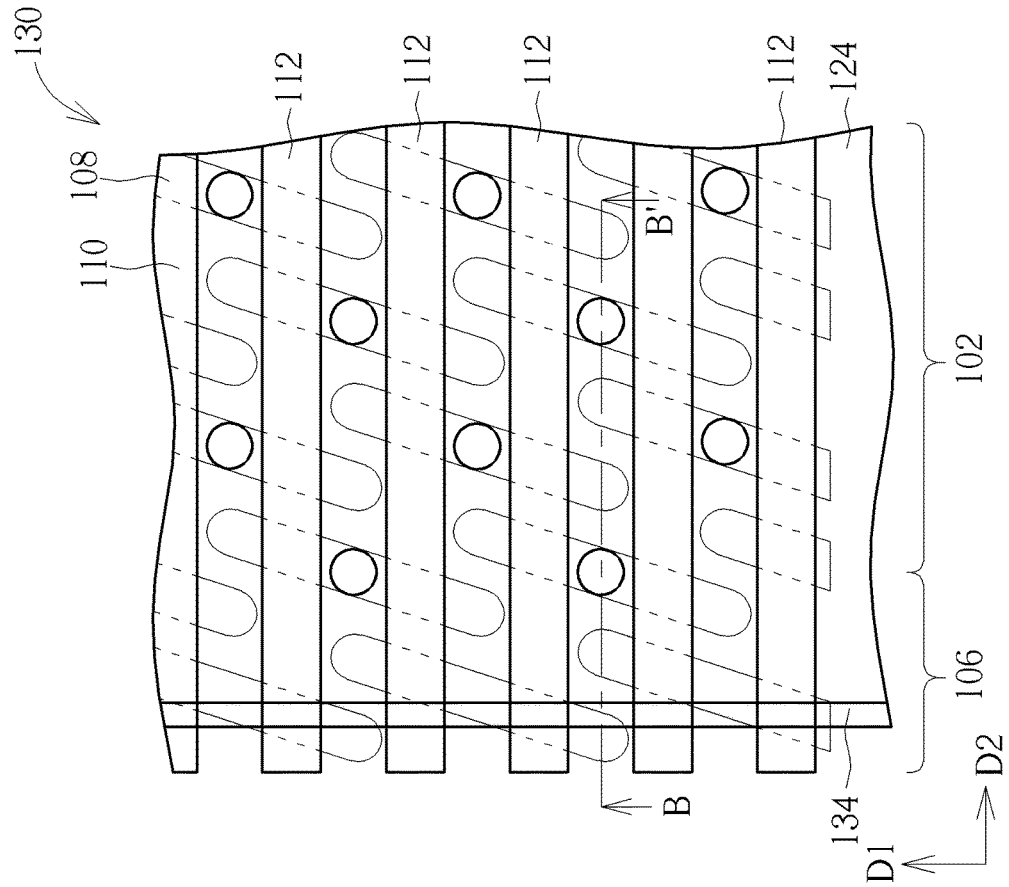
Figure 2A:
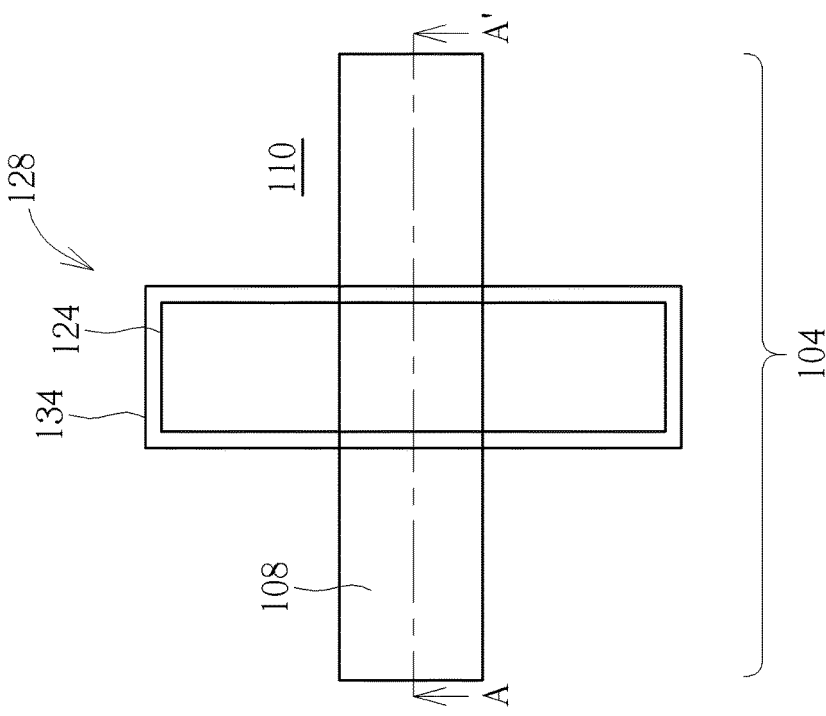
Figure 2B:
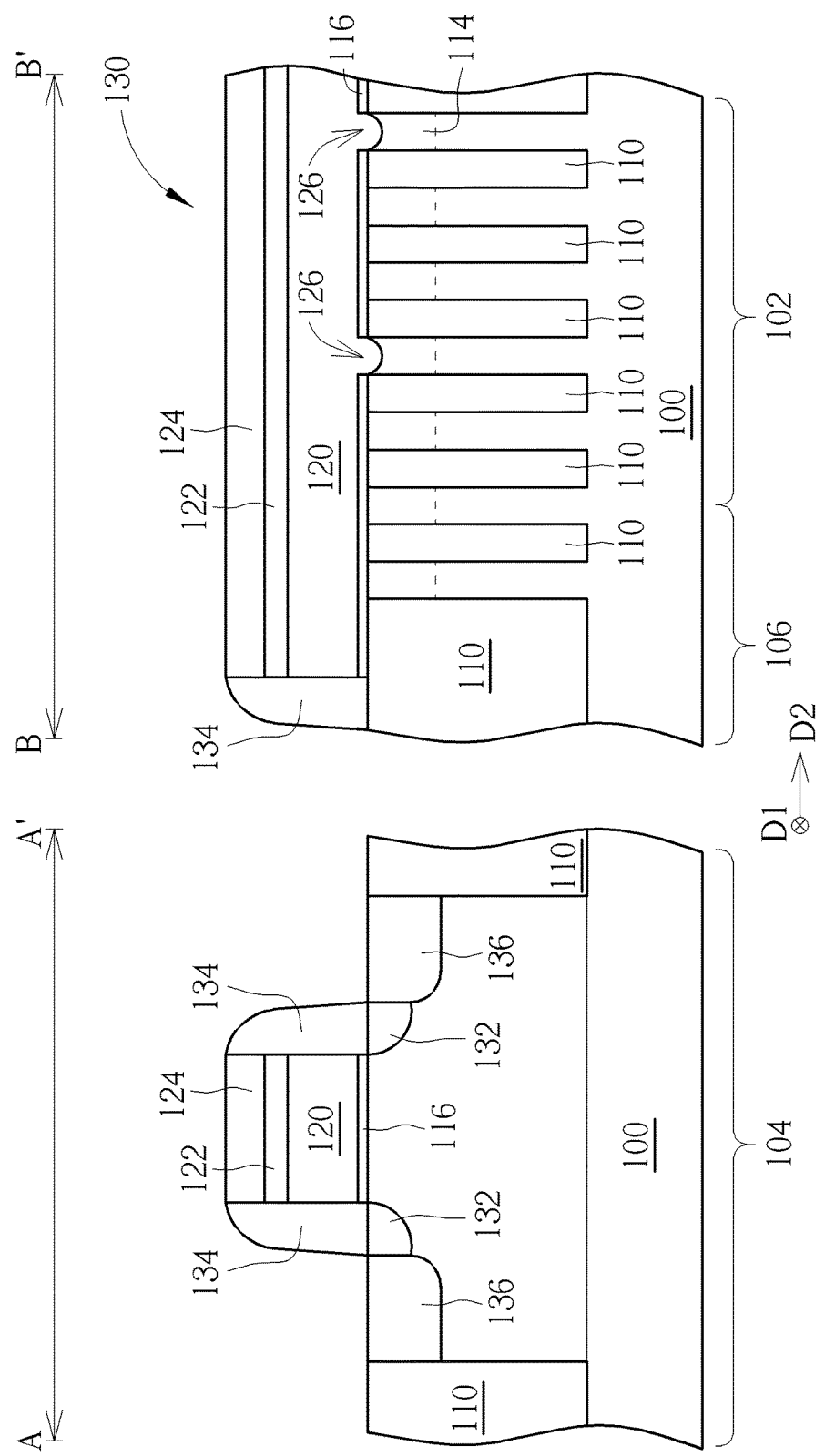
FIG. 2B is a cross-sectional view taken along the Lines A-A' and B-B' of FIG. 2A.

Please refer to FIGS. 2A and 2B. Next, a semiconductor layer 120, a metal-containing layer 122 and a patterned hard mask 124 are sequentially formed on the substrate 100. In some embodiments of the present invention, the semiconductor layer 120 can include a doped polysilicon layer, and the metal-containing layer 122 can be a metal layer and/or a metal silicide layer, but not limited to this. It is noteworthy that the recesses 118 are filled up with the semiconductor layer 120 as shown in FIG. 2B, and the semiconductor layer 120 in the recesses 118 therefore serves a plurality of contact plugs 126. It is noteworthy that locations and amounts of the contact plugs are only exemplified in FIG. 2A, but not limited to this. Thereafter, a patterning process is performed to etch the metal-containing layer 122, the semiconductor layer 120 and the insulating layer 116 through the patterned hard mask 124. Consequently, at least a gate structure 128 is formed in the peripheral circuit region 104, and the insulating layer 116 serves as a gate insulating layer of the gate structure 128. It is noteworthy that portions of the semiconductor layer 120, the metal-containing layer 122 and the insulating layer 116 in the cell edge region 106 are patterned while those layers in the memory cell region 102 are protected by the patterned hard mask 124. Therefore, a bulk structure 130 is formed in the memory cell region 102 and the cell edge region 106 by performing the patterning process, and the bulk structure 130 covers the entire memory cell region 102, as shown in FIGS. 2A and 2B.

Please still refer to FIGS. 2A and 2B. After forming the gate structure 128 and the bulk structure 130, elements required in the peripheral circuit region 104 are formed. For example, lightly-doped drains (LDDs) 132 (shown in FIG. 2B) are formed at two sides of the gate structure 128 and followed by forming a spacer 134 on sidewalls of the gate structure 128 and the bulk structure 130, respectively, as shown in FIGS. 2A and 2B. After forming the spacers 134, source/drain regions 136 are formed in the substrate 100 at the two sides of the gate structure 128 in the peripheral circuit region 104 (shown in FIG. 2B).

Figure 3:
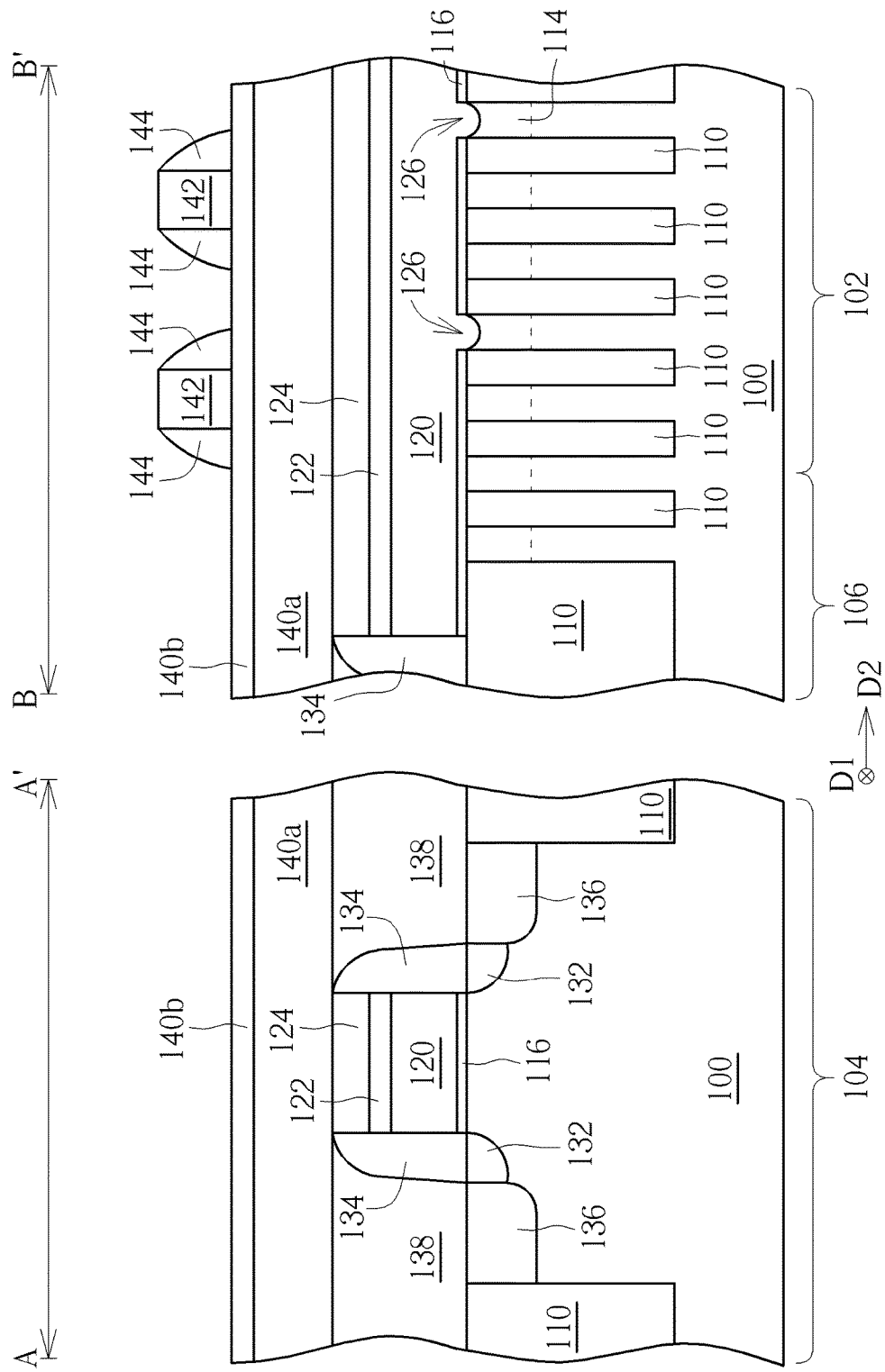
Figure 4:
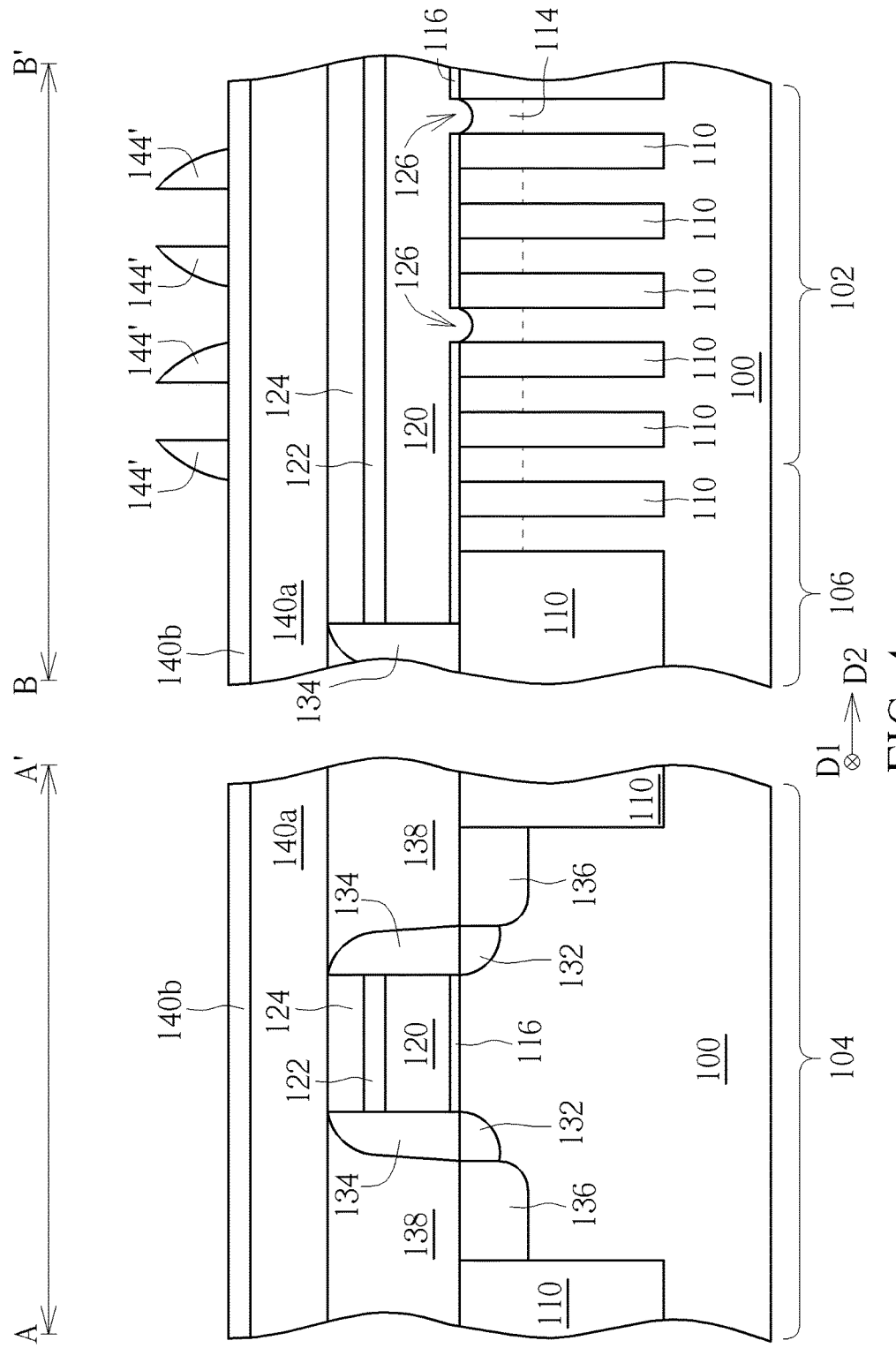
Figure 5:
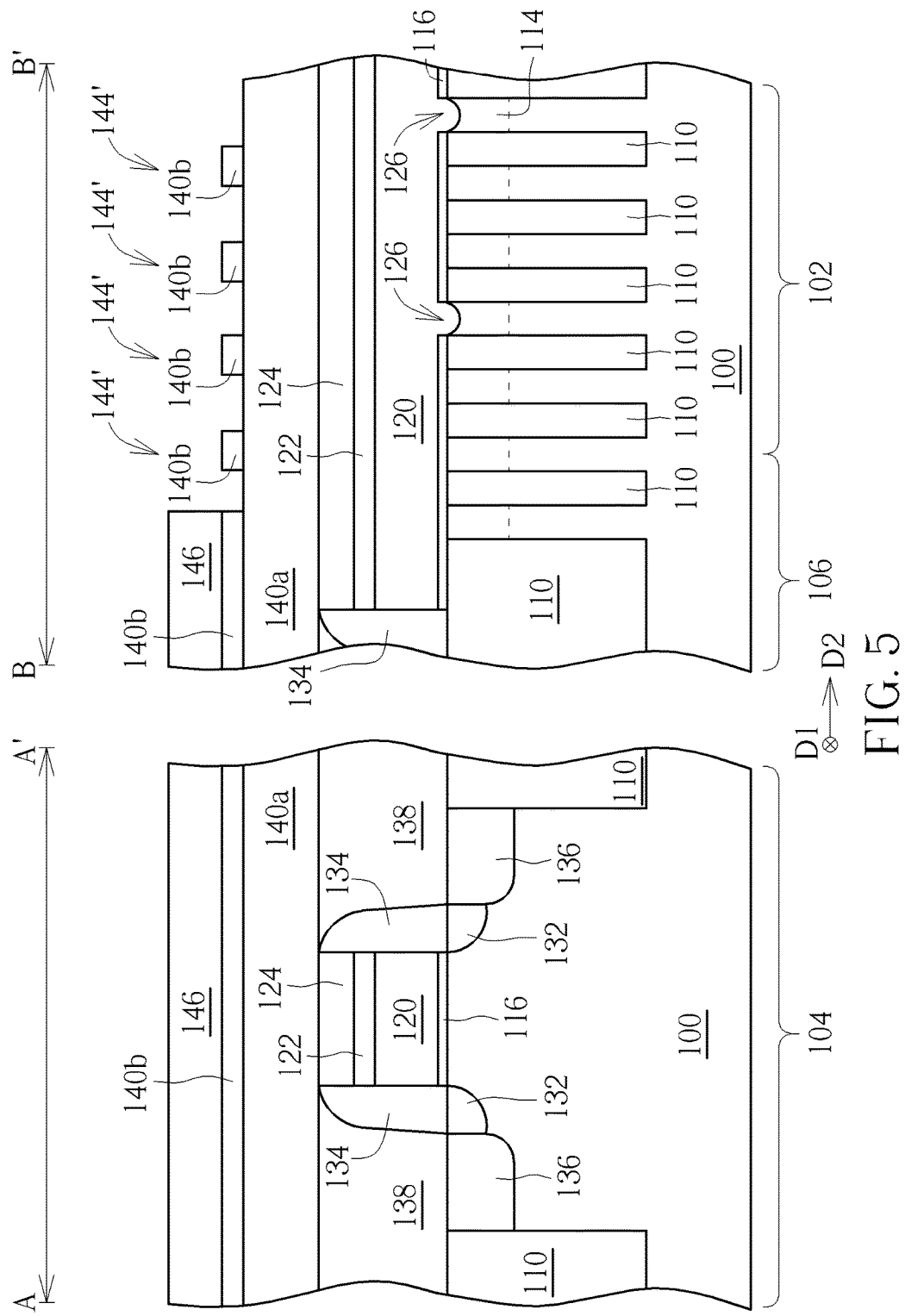

Please refer to FIG. 3. It should be noted that FIGS. 3-5 are schematic drawings in steps subsequent to FIG. 2B. That is, FIGS. 3-5 are cross-sectional views, however those skilled in the art would easily understood the plan view according to FIGS. 3-5. As shown in FIG. 3, after forming the elements required in the peripheral circuit region 104, an interlayer dielectric (hereinafter abbreviated as ILD) layer 138 is blanketly formed on the substrate 100. And the ILD layer 138 fills up vacancies on the substrate 100 as shown in FIG. 3. A hard mask layer 140a and a hard mask layer 140b are then sequentially formed on the ILD layer 138. In the preferred embodiment, the hard mask layers 140a/140b are layers including etching rates different from an etching rate of the ILD layer 138. It is noteworthy that the method provided by the preferred embodiment can be integrated with multiple patterning process such as, for example but not limited to, sidewall image transfer (SIT) method, also known as spacer self-aligned double-patterning (SADP). And the multiple patterning process is performed to form bit lines, therefore the tiny and fine bit lines can be precisely formed. As shown in FIG. 3, a plurality of mandrel patterns 142 are formed on the hard mask layer 140*b* in the memory cell region 102 and the cell edge region 106 according to the preferred embodiment. The mandrel patterns 142 can include polysilicon, but not limited to this. As shown in FIG. 3, the mandrel patterns 142 extend along the first direction D1 and are arranged along the second direction D2, thus the mandrel patterns 142 are parallel with each other on the substrate 100. After forming the mandrel patterns 142, a layer including an etching rate different from the etching rate of the mandrel patterns 142 is formed on the substrate 100. In some embodiments of the present invention, the mandrel patterns 142 include the polysilicon and the layer preferably includes an insulating layer, for instance. The layer is then etched back and thus a plurality of spacers 144 are formed on sidewalls of the mandrel patterns 142 as shown in FIG. 3.

Please refer to FIG. 4. Next, the mandrel patterns 142 are removed from the substrate 100 and a plurality of spacer patterns 144' are obtained. It should be understood that since the etching rates of the spacers 144 and the mandrel patterns 142 are different, the mandrel patterns 142 are removed without impacting profiles of the spacers 144. As shown in FIG. 4, the spacer patterns 144' extend along the first direction D and are arranged along the second direction D2, and thus the spacer patterns 144' are parallel with each other on the substrate 100. Also as shown in FIG. 4, the hard mask layer 140*b* is exposed in between the spacer patterns 144' after removing the mandrel patterns 142.

Please refer to FIG. 5. Next, a protecting layer 146 covering the peripheral circuit region 104 and the cell edge region 104 is formed on the substrate 100, and the spacer patterns 144' are transferred to the hard mask layer 140*b* after forming the protecting layer 146 as shown in FIG. 5. It is noteworthy that in some embodiments of the present invention, a cutting step can be performed simultaneously with transferring the spacer patterns 144' to the hard mask layer 140*b*. The cutting step is performed to remove unnecessary portions of the spacer patterns 144' (as depicted by the dotted line in FIG. 6A). However, those skilled in the art would easily realize that the cutting step can be formed at other time point depending on different requirements.

Figure 6B:
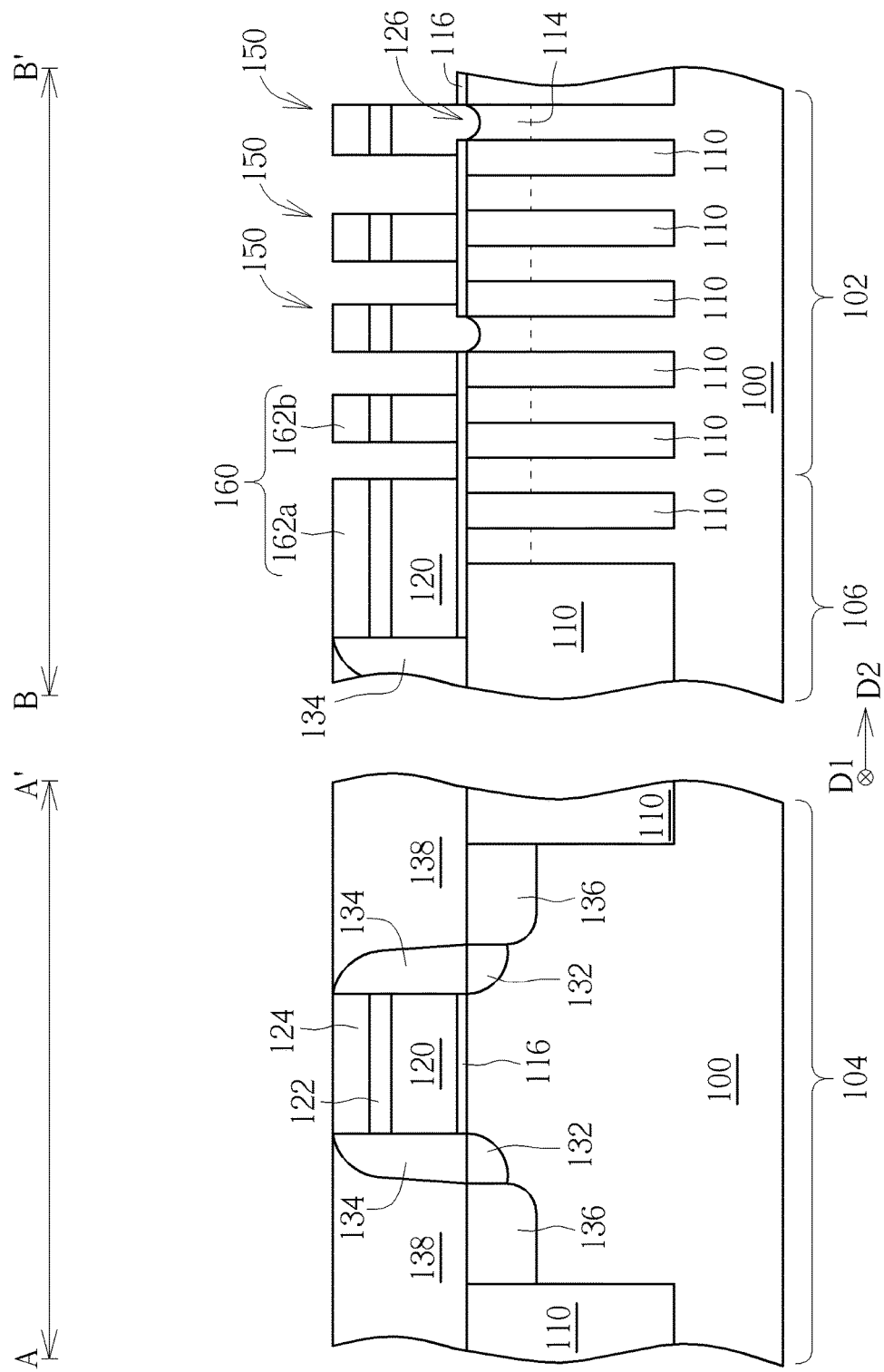

Please refer to FIGS. 6A and 6B. Next, the spacer patterns 144' are transferred to the patterned hard mask 124, the metal-containing layer 122 and the semiconductor layer 120 through the hard mask layer 140*b*. Consequently, a plurality of bit lines 150 are formed in the memory cell region 102, and at least a dummy bit line 160 is formed in the cell edge region 106. Then, the hard mask layers 140*a* and 140*b* are removed. As shown in FIGS. 6A and 6B, the bit lines 150 are formed on the active regions 108 in the memory cell region 102. And the bit lines 150 extend along the first direction D1 and are arranged along the second direction D2. As shown in FIGS. 6A and 6B, the bit lines 150 overlap the active regions 108 along the first direction D1 and are electrically connected to the active regions 108 by the contact plugs 126. In details, the bit lines 150 are electrically connected to the source/drain regions respectively by the contact plugs 126. On the other hand, the dummy bit line 160 is formed on the active regions 108 in the cell edge region 106. The dummy bit line 160 extends along the first direction D1 and overlaps at least two active regions 108 along the second direction D2. More important, the bit lines 150 are electrically isolated from the dummy bit line 160 while the bit lines 150 itself are electrically isolated from each other. Furthermore, it is concluded that the gate structure 128 in the peripheral circuit region 104, the dummy bit line 160 in the cell edge region 106, and the bit lines 150 in the memory cell region 102 include the same material and the same height according to the abovementioned steps in accordance with the preferred embodiment, but the gate structure 128 is formed before the bit lines 150 and the dummy bit line 160.

Please still refer to FIGS. 6A and 6B. According to the preferred embodiment, the dummy bit line 160 includes an outer line portion 162*a* and an inner line portion 162*b* both extending along the first direction D1. Furthermore, the outer line portion 162*a* and the inner line portion 162*b* respectively overlap one active region 108 along the second direction D2. Therefore the dummy bit line 160 (including the outer line portion 162*a* and the inner line portion 162*b*) overlaps two active regions 108 along the second direction D2. Additionally, in other embodiments of the present invention, the outer line portion 162*a* itself can overlap at least two active regions 108. According to the preferred embodiment, the inner line portion 162*b* is electrically connected to the active region 108 by the contact plug 126 as shown in FIG. 6A. However, since the inner line portion 162*b* is electrically isolated from the bit lines 150, the inner line portion 162*b* is not involved in operation. On the other hand, the outer line portion 162*a* is electrically isolated from the active regions 108 by the insulating layer 116. More important, the outer line portion 162*a* is formed by etching through the protecting layer 146 while the inner line portion 162*b* is formed by etching through the spacer patterns 144', therefore a width of the inner line portion 162*b* is different from a width of the outer line portion 162*a*.

Figure 7A:
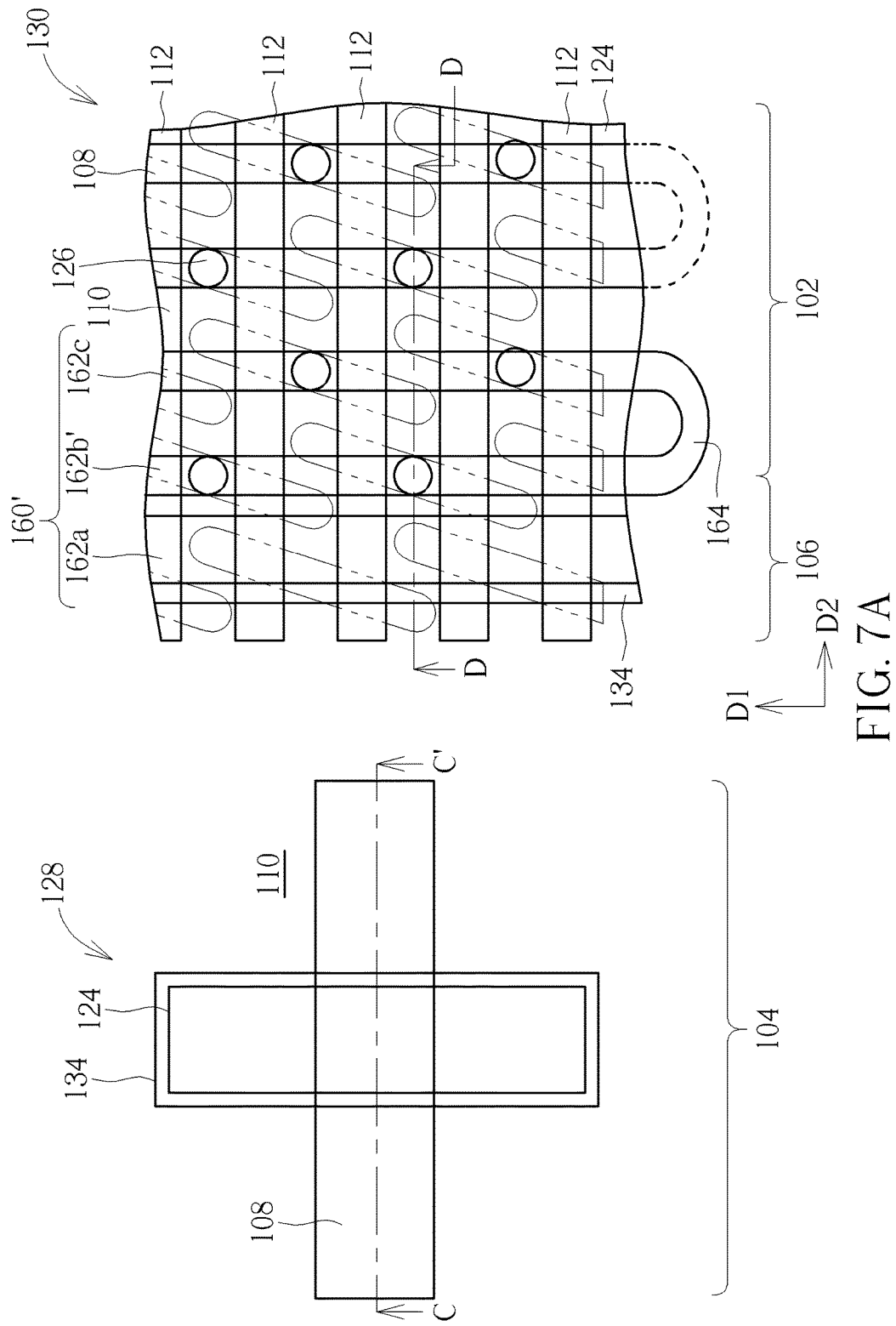
Figure 7B:
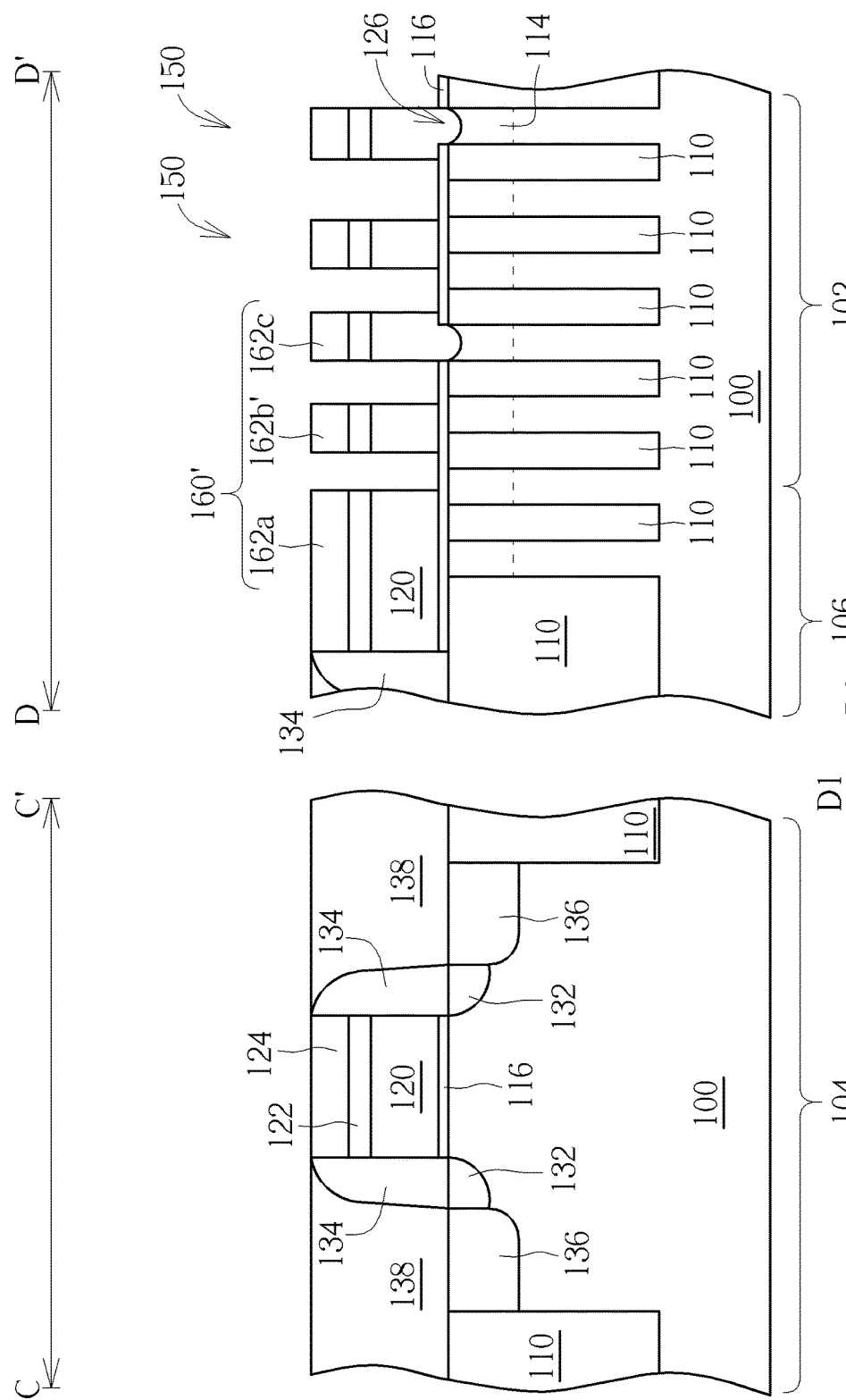

Please refer to FIG. 7A-7B, which are schematic drawings illustrating a modification to the preferred embodiment, and FIG. 7B is a cross-sectional taken along Lines C-C' and D-D' of FIG. 7A. As shown in FIGS. 7A and 7B, according to the modification, the dummy bit line 160' includes an outer line portion 162*a*, a first inner line portion 162*b'* and a second inner line portion 162*c* all extending along the first direction D1, and a curve portion 164 connecting the first inner line portion 162*b'* and the second inner line portion 162*c*. The outer line portion 162*a*, the first inner line portion 162*b'* and the second inner line portion 162*c* respectively overlap one active region 108 along the second direction D2. Therefore, the dummy bit line 160' (including the outer line portion 162*a*, the first inner line portion 162*b'* and the second inner line portion 162*c*) overlaps more than two active regions 108 along the second direction D2. As shown in FIG. 7A, the curve portion 164 is entirely formed on the isolation structure 110. Furthermore, the first inner line portion 162*b'* and the second inner line portion 162*c* can be electrically connected to the active regions 108 respectively by the contact plugs 126 according to the modification as shown in FIG. 7A. However, the first/second inner line portions 162*b'*/162*c* are electrically isolated from the bit lines 150. Therefore, the first/second inner line portions 162*b'*/162*c* are not involved in the operation. The outer line portion 162*a* is electrically isolated from the active regions 108. More important, the outer line portion 162*a* is formed by etching through the protecting layer 146 while the first/second inner line portions 162*b'*/162*c* are formed by etching through the spacer patterns 144', therefore a width of the first/second inner line portions 162*b'*/162*c* is different from a width of the outer line portion 162*a*.

Figure 8:
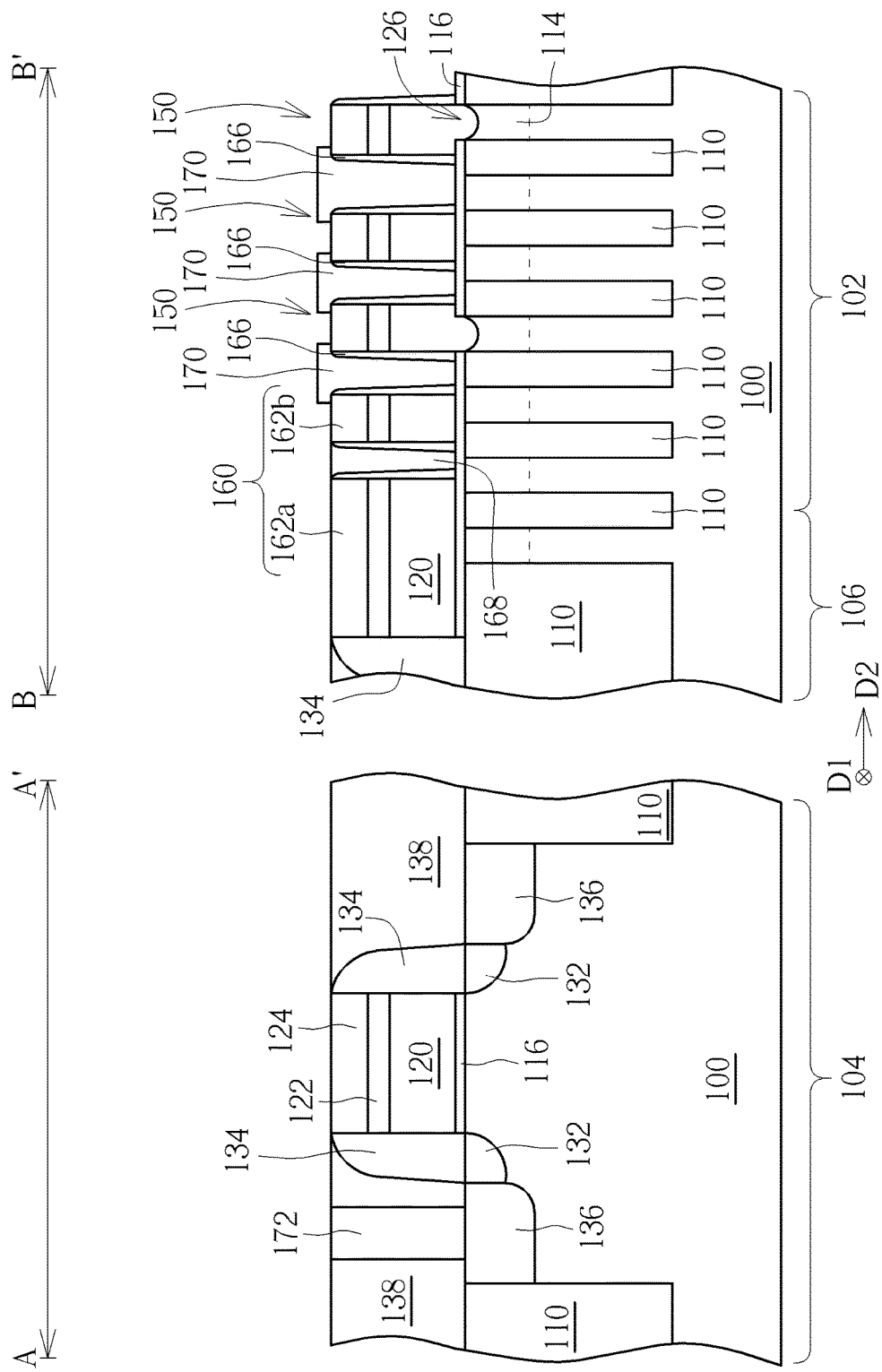

Please refer to FIG. 8. Next, a spacer 166 is formed on sidewalls of the bit lines 150 and the dummy bit line 160, respectively. As shown in FIG. 8, the spacers of the outer line portion 162*a* of the dummy bit line 160 are different from the spacers 166 of the inner line portion 162*b*. The outer line portion 162*a* itself can include different spacers. As shown in FIG. 7, the outer line portion 162*a* of the dummy bit line 160 includes the spacer 134 and the spacer 166, and a width of the spacer 134 is different from a width of the spacer 166. Furthermore, the spacer 134 and the spacer 166 of the outer line portion 162a can include different materials. The inner line portion 162b includes the spacers 166. Comparing the outer line portion 162a of the dummy bit line 160 with the bit lines 150, the outer line portion 162a includes the spacer 134 and the spacer 166 while the bit lines 150 include only the spacers 166. And a width of the spacer 134 of the outer line portion 162a is different from a width of the spacer 166 of the inner line portion 162b and the bit lines 150. On the other hand, the spacer 134 of the outer line portion 162a and the spacer 166 of the inner line portion 162b and the bit lines 150 can include different materials while the spacer 134 of the outer line portion 162a and the spacers 134 of the gate structure 128 in the peripheral circuit region 104 include the same material. Thereafter, an insulating material 168 is formed on the substrate 100, and vacancies between the inner line portion 162b and the outer line portion 162a of the dummy bit line 160 and between the bit lines 150 are filled up. Next, another patterned mask (not shown) is formed on the substrate 100, and portions of the insulating material are removed. Consequently, a plurality of openings (not shown) are formed in the peripheral circuit region 104 and the memory cell region 102. A conductive material is then formed in each opening. As shown in FIG. 7, the conductive material formed in the memory cell region 102 serves as storage node contact plugs 170 and the conductive material formed in the peripheral circuit region 104 serves as contact plugs 172 electrically connecting the source/drain region 136 and other device(s).

According to the semiconductor memory structure provided by the present invention, the gate structure in the peripheral circuit region and the bit lines in the memory cell region are formed separately in sequence. Therefore, process is simplified. Furthermore, since the method provide by the present invention can be integrated in the SIT process, the bit lines can be precisely formed, and thus process yield is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory structure comprising:
    a substrate comprising a memory cell region and a cell edge region adjacent to the memory cell region;
    a plurality of active regions formed in the substrate and in the memory cell region and the cell edge region; and
    at least a dummy bit line formed on the active regions in the cell edge region and extending along a first direction and overlapping at least two active regions along a second direction, wherein the dummy bit line further comprises a first inner line portion and an outer line portion, the first inner line portion and the outer line portion extend along the first direction, and a width of the first inner line portion is different from a width of the outer line portion.

2. The semiconductor memory structure according to claim 1, further comprising a plurality of bit lines formed on the active regions in the memory cell region and extending along the first direction and arranged along the second direction.

3. The semiconductor memory structure according to claim 2, further comprising a plurality of first contact plugs electrically connecting the bit lines to the active regions in the memory cell region, respectively.

4. The semiconductor memory structure according to claim 2, wherein the bit lines are electrically isolated from the dummy bit line.

5. The semiconductor memory structure according to claim 2, wherein the substrate further comprises a peripheral circuit region, and the cell edge region is between the memory cell region and the peripheral circuit region.

6. The semiconductor memory structure according to claim 5, wherein at least a gate structure is formed in the peripheral circuit region, and the gate structure, the bit lines and the dummy bit line comprise a same material.

7. The semiconductor memory structure according to claim 5, wherein the gate structure, the bit lines and the dummy bit line comprise a same height.

8. The semiconductor memory structure according to claim 1, wherein the dummy bit line further comprises a second inner line portion and a curve portion connecting the first inner line portion and the second inner line portion.

9. The semiconductor memory structure according to claim 8, further comprising a plurality of isolation structures formed in the substrate, and the active regions being electrically isolated from each other by the isolation structures.

10. The semiconductor memory structure according to claim 9, wherein the curve portion is entirely formed on the isolation structures.

11. The semiconductor memory structure according to claim 8, further comprising a plurality of second contact plugs electrically connecting the first inner line portion to the active regions in the cell edge region.

12. The semiconductor memory structure according to claim 8, wherein the outer line portion is electrically isolated from the active regions.

13. The semiconductor memory structure according to claim 1, further comprising at least an insulating material formed in between the first inner line portion and the outer line portion.

14. The semiconductor memory structure according to claim 1, wherein a first spacer is formed on a sidewall of the outer line portion, and a second spacer is formed on another sidewall of the outer line portion and is between the outer line portion and the first inner line portion.

15. The semiconductor memory structure according to claim 14, wherein the first spacer and the second spacer have different materials.

16. The semiconductor memory structure according to claim 14, wherein the first spacer and the second spacer have different widths.

17. The semiconductor memory structure according to claim 14, wherein the second spacer is also formed on a sidewall of the first inner line portion.

18. The semiconductor memory structure according to claim 17, wherein the second spacer is also formed on sidewalls of plural bit lines formed in the memory cell region.

19. The semiconductor memory structure according to claim 1, wherein the outer line portion overlaps at least two active regions.

* * * * *